United States Patent [19]
Hamada et al.

[11] Patent Number: 5,966,765
[45] Date of Patent: Oct. 19, 1999

[54] CLEANING APPARATUS

[75] Inventors: Satomi Hamada, Fujisawa; Toshiro Maekawa, Sagamihara; Toshiya Takeuchi, Tokyo, all of Japan

[73] Assignee: Ebara Corporation, Tokyo, Japan

[21] Appl. No.: 08/955,292

[22] Filed: Oct. 21, 1997

[30] Foreign Application Priority Data

Oct. 21, 1996 [JP] Japan ................................ 8-297751

[51] Int. Cl.$^6$ ................................................ A46B 13/02
[52] U.S. Cl. ............................... 15/77; 15/102; 15/88.2; 15/21.1; 15/88.3
[58] Field of Search ................................... 15/88.2, 88.3, 15/77, 102, 21.1; 134/153, 902

[56] References Cited

U.S. PATENT DOCUMENTS

| | | | |
|---|---|---|---|
| 4,788,994 | 12/1988 | Shinbara | 134/157 |
| 5,351,360 | 10/1994 | Suzuki et al. | 15/302 |
| 5,361,449 | 11/1994 | Akimoto | 15/302 |
| 5,421,056 | 6/1995 | Tateyama et al. | 15/302 |
| 5,675,856 | 10/1997 | Itzkowitz | 15/77 |
| 5,685,039 | 11/1997 | Hamada et al. | 15/88.2 |
| 5,868,866 | 2/1999 | Maekawa et al. | . |

FOREIGN PATENT DOCUMENTS

| | | |
|---|---|---|
| 0 526 245 | 2/1993 | European Pat. Off. . |
| 2 724 053 | 3/1996 | France . |
| 60-143634 | 7/1985 | Japan . |
| 2-197126 | 8/1990 | Japan . |
| 4-53684 | 2/1992 | Japan . |

OTHER PUBLICATIONS

Patent Abstracts of Japan, vol. 096, No. 004, Apr. 30, 1996 & JP 07 335599 A (Dainippon Screen Mfg. Co. Ltd.), Dec. 22, 1995, * abstract; figures 12–14, 16–20 * figures 24, 25, 27 *.

Pending U.S. Patent Application Serial No. 08/609,686, filed Mar. 1, 1996, entitled "Method of and Apparatus for Cleaning Workpiece", located in Group Art Unit 1743, by Toshiro Maekawa et al.

*Primary Examiner*—Randall E. Chin
*Assistant Examiner*—Jennifer McNeil
*Attorney, Agent, or Firm*—Wenderoth, Lind & Ponack, L.L.P.

[57] ABSTRACT

A cleaning apparatus is used for cleaning a thin disk-shaped workpiece such as a semiconductor wafer, a liquid crystal display or the like. The cleaning apparatus comprises a support mechanism for supporting a workpiece and rotating the workpiece about its own axis, and a cleaning member for being in sliding contact with at least one of opposite surfaces of the workpiece. The support mechanism comprises a plurality of spindles, and a plurality of rotatable holding portions provided on upper ends of the spindles and having respective circumferential edges engageable with a circumferential edge of the workpiece. The plurality of spindles are clustered into groups around the workpiece, and two adjacent groups of the spindles are positioned to form a wide spacing between two adjacent groups of the spindles, and a path along which the workpiece is supplied to and removed from the support mechanism is positioned in the wide spacing.

17 Claims, 6 Drawing Sheets

CLEANING APPARATUS

BACKGROUND OF THE INVENTION

1. Field of the Invention

The present invention relates to a cleaning apparatus for cleaning a workpiece that needs to have a high degree of cleanness, e.g., a semiconductor wafer, a glass substrate, a liquid crystal display, or the like.

2. Description of the Prior Art

As semiconductor devices become more highly integrated in recently years, circuit interconnections on semiconductor substrates become finer and distances between such circuit interconnections become smaller. When semiconductor wafers are processed, small particles such as particles of semiconductor material, dust particles, crystalline protrusive particles, or the like often tend to be attached to the semiconductor wafers being processed. If a particle greater than the distance between interconnections exists on a semiconductor substrate, then the particle will short-circuit interconnections on the semiconductor substrate. Therefore, any undesirable particles on a semiconductor substrate have to be sufficiently smaller than the distance between interconnections on the semiconductor substrate. Such a problem and a requirement hold true for the processing of other workpieces including a glass substrate to be used as a mask, a liquid crystal display, and so on. To meet the above requirement, there have been practiced some cleaning procedures for removing fine particles or submicron particles from semiconductor wafers.

For example, there has heretofore been one practice to use a brush of nylon, mohair or the like, or a sponge of polyvinyl alcohol (PVA) to scrub a surface of a semiconductor wafer. This process is called a scrubbing cleaning process. Further, there have been other practices, one of which is an ultrasonic cleaning process in which water having ultrasonic vibrational energy applied thereto is supplied to a surface of a semiconductor wafer, the another of which is a cavitation jet cleaning process in which high pressure water containing cavitation therein is supplied to a surface of a semiconductor wafer. Also, a cleaning process which combines two c)r three of the above processes is known in the art.

Figure 4:
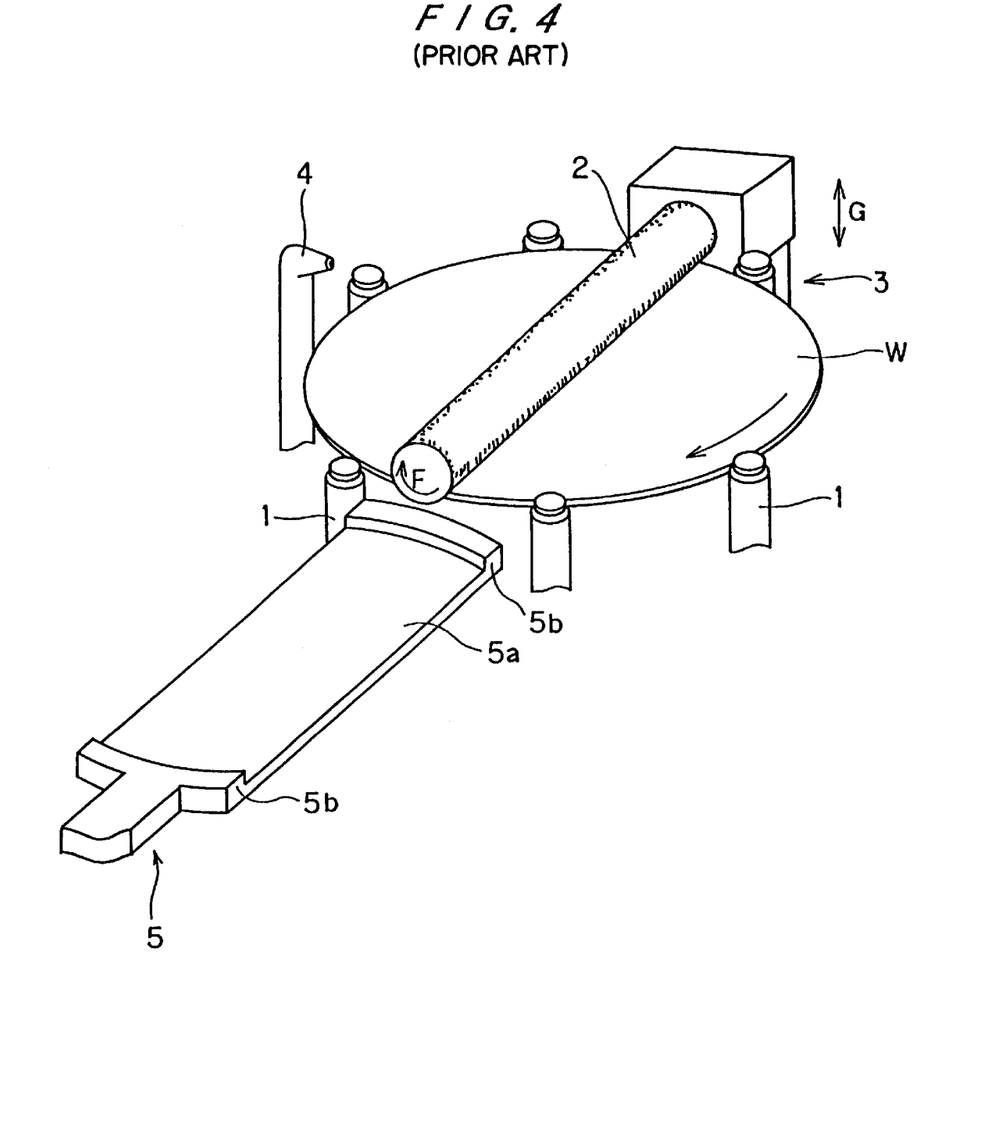
FIG. 4 is a fragmentary perspective view of a conventional cleaning apparatus.

FIG. 4 of the accompanying drawings shows a known scrubbing cleaning apparatus for cleaning a semiconductor wafer. As shown in FIG. 4, the scrubbing cleaning apparatus has a plurality of vertical spindles (six in FIG. 4) 1 for supporting a circumferential edge of a circular semiconductor wafer W and rotating the semiconductor wafer W, a brush arm 2 disposed over the semiconductor wafer W and extending diametrically in one direction across and parallel to the semiconductor wafer W, a brush actuating mechanism 3 for vertically moving the brush arm 2 as indicated by the arrow G and rotating the brush arm 2 about its own axis as indicated by the arrow F, and a cleaning liquid nozzle 4 for supplying a cleaning liquid such as deionized water (pure water) to a surface to be cleaned of the semiconductor wafer W. The brush arm 2 has a brush on its entire cylindrical surface. The semiconductor wafer W has an orientation flat formed by cutting off a portion of its circular circumferential edge.

The spindles 1 are positioned at substantially equal intervals on a circle around the semiconductor wafer W. Since the brush arm 2 needs to be held in sliding contact with the entire surface of the semiconductor wafer W, the brush arm 2 has an axial length greater than the maximum dimension or diameter of the semiconductor wafer W. The brush arm 2 is arranged so as not to physically interfere with the spindles 1.

The semiconductor wafer W is supplied to the scrubbing cleaning apparatus from outside the scrubbing cleaning apparatus. A process of supplying the semiconductor wafer W to the scrubbing cleaning apparatus will be described below:

The spindles 1 are displaced away from the position shown in FIG. 4. In such a state, the semiconductor wafer W is fed by a robot hand 5 from a diametrically opposite position remote from the brush actuating mechanism 3 along the longitudinal axis of the brush arm 2 to a position over the spindles 1. The robot hand 5 has a substantially rectangular-shaped support portion 5a for supporting the semiconductor wafer W, and guide portions 5b, projecting from the supporting portion 5a for engaging with the outer peripheral edge of the semiconductor wafer W. The width of the support portion 5a is set to be smaller than the spacing between adjacent ones of the spindles 1. The rear end of the robot hand 5 is connected to a robot (not shown). The robot hand is then lowered to place the outer peripheral portion of the semiconductor wafer IV on the shoulders of holding portions of the spindles. and the spindles 1 are displaced inwardly to the position shown in FIG. 4 for holding the circumferential edge of the semiconductor wafer W by the holding portions of the spindles. Thereafter, the robot hand is further lowered and then moved back away from the scrubbing cleaning apparatus. While the semiconductor wafer W is being thus supplied, the brush arm 2 is retreated upwardly away from the spindles 1 by the brush actuating mechanism 3.

Thereafter, the brush actuating mechanism 3 is operated to lower the brush arm 2 toward the semiconductor water W until the brush arm 2 is brought into contact with the semiconductor wafer W. While a cleaning liquid is supplied from the cleaning liquid nozzle 4 to the surface of the semiconductor wafer W, the semiconductor wafer W and the brush arm 2 are rotated, thus cleaning the upper surface of the semiconductor wafer W. In FIG. 4, only the upper surface of the semiconductor wafer W is cleaned, however, another brush arm 2 may also be provided underneath the semiconductor wafer W so that both of the upper and lower surfaces of the semiconductor wafer W are cleaned simultaneously.

Because the spindles 1 are positioned at substantially equal intervals around the semiconductor wafer W, the spacing between adjacent ones of the spindles 1 is relatively small. The robot hand is moved in close proximity to the spindles 1, and the brush arm 2 is positioned relatively closely to the spindles 1. Therefore, the spindles 1, the robot hand, and the brush arm 2 need to be positioned such that they are kept out of physical contact with each other when the robot hand moves toward and away from the scrubbing cleaning apparatus.

It is difficult to position an additional brush arm underneath the semiconductor wafer W because the additional brush arm must be located between the spindles 1. Inasmuch as the robot hand needs to move between the spindles 1, it is not easy to determine a path along which the robot hand can move toward and away from the scrubbing cleaning apparatus. Designing the dimensions and path of the robot hand, the diameter and position of the brush arm 2, and the diameter of the spindles 1 suffers many limitations as the robot hand, the brush arm 2 and the spindles 1 must be kept out of physical contact with each other.

Figure 5A:
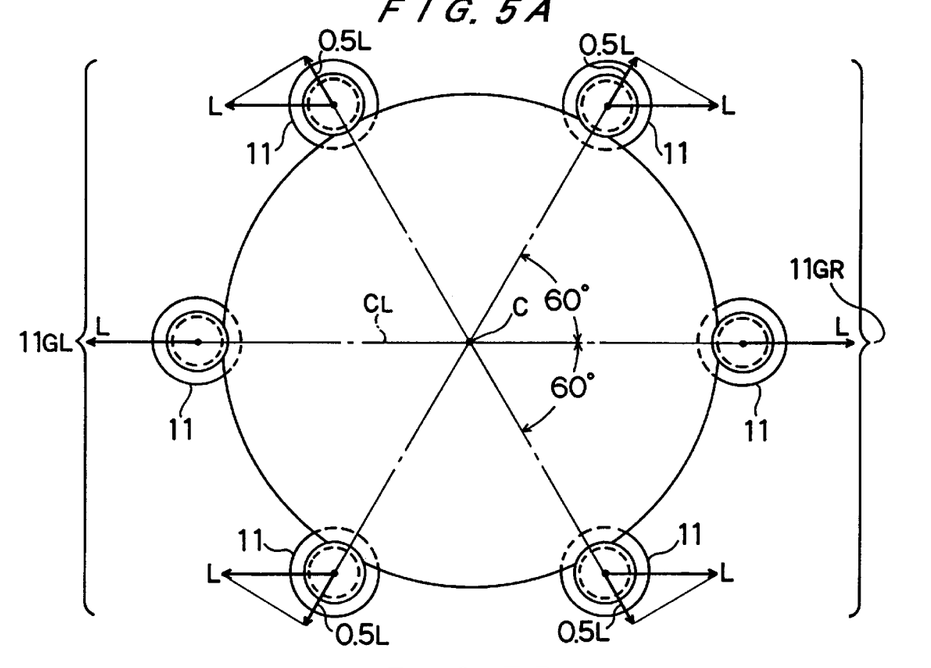
FIGS. 5A and 5B are plan views showing the relationship between the semiconductor wafer and holding portions of spindles.

Further, since the spindles 1 are positioned at substantially equal intervals on a circle around the semiconductor wafer W, when the semiconductor wafer W is fed to the scrubbing cleaning apparatus, all of the spindles are not displaced so as to form equal clearance between the holding portions of the spindles and the semiconductor wafer W. To be more specific, in the conventional scrubbing cleaning apparatus, as shown in FIG. 5A, all of the spindles are positioned at 60° intervals around a center C of the semiconductor wafer W to be supplied. The six spindles 11 are divided into two groups 11GR, 11GL, each comprising three spindles 11, which are independently driven by driving mechanisms, and the two groups 11GR, 11GL of the spindles 11 are displaced outwardly along a center line $C_L$ in opposite directions so that all of the spindles 11 are spaced from the semiconductor wafer W. Assuming that each of the groups 11GR, 11GL of the spindles 11 is displaced along the center line $C_L$ by a distance L, the spindle 11 positioned on the center line $C_L$ is also displaced by the distance L in a radial direction from the center C of the semiconductor wafer W to be supplied. However, the other two spindles 11 positioned apart from the center line $C_L$ are displaced by the distance L cos 60° =0.5 L in a radial direction from the center C of the semiconductor wafer W to be supplied. In this case, if the distance L is too large, the shoulder of the spindle 11 cannot receive the outer peripheral portion of the semiconductor wafer W when the semiconductor wafer is lowered by the robot hand H. Thus, it is necessary to set the distance L to be within the width of the shoulder of the spindle. This means that a suitable clearance is required to properly transfer the semiconductor wafer to the spindles. However, since a suitable clearance between the holding portions of the spindles 11 and the semiconductor wafer W cannot be formed at the spindles 11 positioned apart from the center line $C_L$, when positioning the semiconductor wafer among the spindles, there are some cases in which the circuniferantial edge of the semiconductor wafer contacts the top of the spindle 11.

SUMMARY OF THE INVENTION

It is therefore an object of the present invention to provide a cleaning apparatus which allows a cleaning member such as a roll brush or a brush arm to be installed with ease, makes it easy to establish a path along which a robot hand moves toward and away from the cleaning apparatus, and which can be designed with relatively large freedom.

An other object of the present invention is to provide a cleaning apparatus which has a support mechanism comprising a plurality of spindles which are displaced so as to form a sufficient clearance between the holding portions of the spindles and the semiconductor wafer when positioning the semiconductor wafer among the spindles.

According to the present invention, there is provided an apparatus for cleaning a thin disk-shaped workpiece, comprising: a support mechanism for supporting a workpiece and rotating the workpiece about its own axis; a cleaning member for being in sliding contact with at least one of opposite surfaces of the workpiece, the cleaning member being rotatable about its own axis; and a nozzle for supplying a cleaning liquid to at least one of the opposite surfaces of the workpiece; wherein the support mechanism comprises a plurality of spindles, and a plurality of rotatable holding portions provided on upper ends of the spindles and having respective circumferential edges engageable with a circumferential edge of the workpiece. The plurality of spindles are clustered into groups around the workpiece, and two adjacent groups of the spindles are positioned to form a wide spacing between the adjacent two groups of the spindles, and a path along which the workpiece is supplied to and removed from the support mechanism is positioned in the wide spacing.

According to the present invention, the holding portions of the spindles are clustered into closely positioned groups so as not to physically interfere with a robot hand which supplies the workpiece and the cleaning member. Therefore, the robot hand, the cleaning member and the holding portions of the spindles may be positioned in widely spaced relation to each other. Consequently, the cleaning member may be installed with ease and the robot hand may be moved easily along a desired path. Furthermore, the dimensions and path of the robot hand, the diameter and position of the cleaning member, and the diameter of the holding portions of the spindles can be designed with greater freedom.

In a preferred aspect of the present invention, the workpiece has a substantially circular shape, the groups of the spindles comprise two groups of not less than three spindles, and when each of the two groups of the spindles is displaced as an integral group by a distance L in a radial direction from a center of the workpiece, all of the spindles in the each group are displaced in the radial direction from the center of the workpiece by a distance of not less than 0.7 L.

With the above arrangement, when positioning the workpiece among the spindles before holding the workpiece, a sufficient clearance between all of the holding portions of the spindles and the workpiece can be formed to thus prevent the peripheral edge of the workpiece from contacting the top of the spindle.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

The principles of the present invention are particularly useful when embodied as a cleaning apparatus for cleaning a semiconductor wafer which has been polished by a polishing apparatus.

In a polishing process, a semiconductor wafer W is polished to a flat mirror finish while an abrasive liquid containing abrasive grains is supplied onto the semiconductor wafer W. Therefore, the semiconductor wafer W which has been polished carries on its surface abrasive grains contained in the abrasive liquid and ground-off particles of the semiconductor wafer, and is contaminated greatly. For example, a semiconductor wafer having a diameter of eight inches (200 mm), carries hundreds of thousands of particles having diameters of 1 $\mu$m or greater after polishing.

According to the present invention, the polished surface of the semiconductor wafer is cleaned by a plurality of cleaning processes.

According to a first cleaning process, a polished circular semiconductor wafer W is held horizontally by a cleaning apparatus (not shown), and a cleaning liquid such as ultrapure water is applied from nozzles to opposite surfaces of the semiconductor wafer W to wash away abrasive particles and ground-off particles from the opposite surfaces of the semiconductor wafer W. At this time, the semiconductor wafer W may be rotated about its own axis. The ultrapure water having a high pressure may be ejected from the nozzles to the opposite surfaces of the semiconductor wafer W. Alternatively, ultrapure water containing cavitation therein may be ejected to the opposite surfaces of the semiconductor wafer W, or ultrapure water to which ultrasonic vibration energy is imparted may be ejected to the opposite surfaces of the semiconductor wafer W. A combination of the above water ejection methods may also be used.

Figure 1:
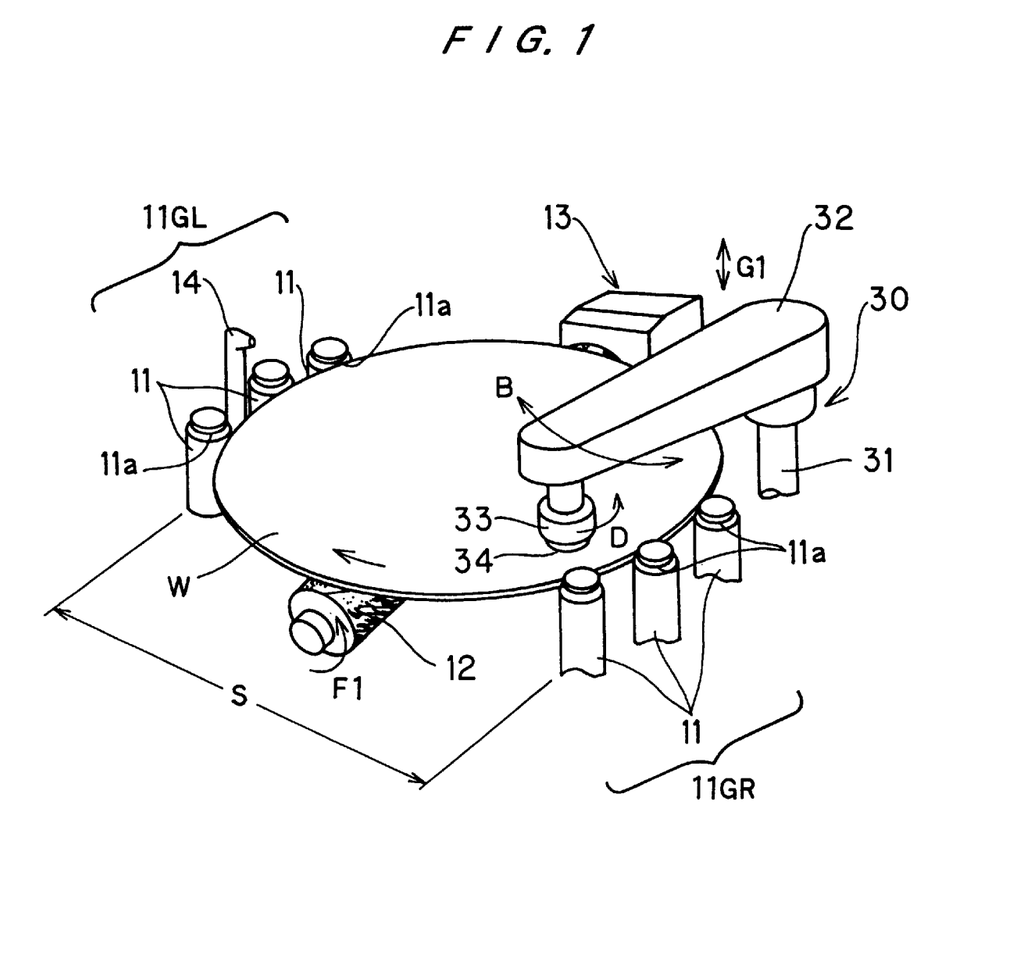
FIG. 1 is a fragmentary perspective view of a cleaning apparatus used in a second cleaning process according to the present invention.

According to a second cleaning process, a brush cleaning apparatus shown in FIG. 1 is employed to clean the semiconductor wafer W. As shown in FIG. 1, the brush cleaning apparatus comprises six spindles 11 for supporting a circumferential edge of the semiconductor wafer W and rotating the semiconductor wafer W about its own axis, a brush arm 12 comprising a roll brush extending diametrically in one direction beneath the semiconductor wafer W and having a number of projections on its entire cylindrical surface, and a brush actuating mechanism 13 for vertically moving the brush arm 12 as indicated by the arrow G1 and rotating the brush arm 2 about its own axis as indicated by the arrow F1. The brush cleaning apparatus further comprises a pair of cleaning liquid nozzles 14 (only one is shown) for supplying a cleaning liquid such as ultrapure water to upper and lower surfaces; of the semiconductor wafer W. The brush arm 12 is made of PVA or the like. The illustrated cleaning liquid nozzle 14 faces the upper surface of the semiconductor wafer W, whereas the non-illustrated cleaning liquid nozzle 14 faces the lower surface of the semiconductor wafer W. The semiconductor wafer W has an orientation flat formed by cutting off a portion of its circular circumferential edge.

Each of the spindles 11 has on its upper end a holding portion 11a which has a circumferential edge engageable with the circumferential edge of the semiconductor wafer W. The spindles 11 are positioned on a circle along the circumferential edge of the semiconductor wafer W, and clustered into two groups 11GR, 11GL each comprising three spindles 11. The two groups of spindles 11 are positioned one on each side of the brush arm 12 in diametrically opposite relation to each other. A wide spacing S is defiled between the two groups 11GR, 11GL of the spindles 11. The adjacent two spindles 11 in each of the groups has a narrow spacing therebetween. Since the brush arm 12 needs to the held in sliding contact with the entire surface of the semiconductor wafer W, the brush arm 12 has an axial length greater than the maximum dimension or diameter of the semiconductor wafer W. The two groups of the holding portions 11a of the respective spindles 11 are positioned so as not to physically interfere with the brush arm 12 and so as to be substantially symmetrical with respect to the central axis of the semiconductor wafer W.

The holding portions 11a are pressed against the circumferential edge of the semiconductor wafer W, and rotated about their own axes to rotate the semiconductor wafer W about its own axis. Two out of the six holding portions 11a are positively driven to impart rotative forces to the semiconductor wafer W, whereas the remaining four holding portions 11a are idly rotatable as bearings which , support the rotating semiconductor wafer W.

A cleaning unit 30 has a horizontal arm 32 supported on a vertical shaft 31 positioned radially outwardly of the semiconductor wafer W, and a sponge holder 33 disposed on a distal end of the horizontal arm 32 over the semiconductor wafer W. The shaft 31 is vertically movable, and the arm 32 supported on the shaft 31 is vertically movable in unison with the shaft 31 and is angularly movable in the direction indicated by the arrow B when the shaft 31 is rotated about its own axis. A sponge 34 is held on the sponge holder 33 and faces downwardly toward the semiconductor wafer W. The sponge 34 is rotatable about its own axis in the directions indicated by the arrow D when the sponge holder 33 rotates about its own axis. A cleaning cup (not shown) is provided adjacent to one of the two groups of the spindles 11. When scrubbing cleaning is not performed, the sponge holder 33 holding the sponge 34 is placed in the cleaning cup to which pure water can be supplied, thus cleaning the sponge 34 by pure welter.

The semiconductor wafer W is supplied to the cleaning apparatus from outside of the cleaning apparatus.

A process of supplying the semiconductor wafer W to the cleaning apparatus will be described below:

The sponge holder 33 and the sponge 34 are held in the cleaning cup, the brush arm 12 is retreated downwardly of the semiconductor wafer W by the brush actuating mechanism 13, and the two groups 11GR, 11GL of the spindles 11 are spaced linearly away from each other from the position shown in FIG. 1. In such a state, the semiconductor wafer W is fed by a robot hand from a diametrically opposite position remote from the brush actuating mechanism 13 along the longitudinal axis of the brush arm 12 to a position over the spindles 11. The robot hand is then lowered to place the outer peripheral portion of the semiconductor wafer W on the shoulders 11s (see FIGS. 2 and 3) of the holding portions 11a of the spindles 11, and the two groups 11GR, 11GL of the spindles 11 are displaced linearly inwardly to the position shown in FIG. 1 for causing the holding portions 11a of the spindles 11 to hold the circumferential edge of the semiconductor wafer W which has been lowered by the robot hand. The robot hand is then moved back away from the cleaning apparatus.

Thereafter, the shaft 31 is elevated to lift the sponge holder 33 from the cleaning cup, and then rotated to rotate the arm 32 until the sponge holder 33 holding the sponge 34 is positioned over the upper surface of the semiconductor wafer W.

While the semiconductor wafer W is being rotated by the holding portions 11a, the shaft 31 is lowered to press the sponge 34 against the upper surface of the semiconductor wafer W. The brush actuating mechanism 13 is actuated to lift the brush arm 12 toward the semiconductor wafer W until the brush arm 12 is brought into contact with the lower surface of the semiconductor wafer W, and then the brush arm 12 is rotated about its own axis. Therefore, the upper surface of the semiconductor wafer W is scrubbed by the sponge 34, and the lower surface of the semiconductor wafer W is scrubbed by the brush arm 12. The arm 32 is angularly moved about the axis 31 in the direction indicated by the arrow B to cause the sponge 34 to scrub the upper surface of the semiconductor wafer W. While the semiconductor wafer W is being thus cleaned, the cleaning liquid is ejected from the cleaning liquid nozzles 14 to the upper and lower surfaces of the semiconductor wafer W.

The cleaning apparatus is provided with a ring-shaped cover to prevent the cleaning liquid from being scattered around.

After the semiconductor wafer W is cleaned, operation of the cleaning unit 30 is stopped, and the sponge 34 and the brush arm 12 are retreated away from the respective surfaces of the semiconductor wafer W. The sponge holder 33 with the sponge 34 mounted thereon is placed in cleaning cup. The robot hand is moved along the path described above toward the semiconductor wafer W. The two groups 11GR, 11GL of the spindles 11 are moved away from each other. The robot hand holds the semiconductor wafer W, and carries the semiconductor wafer W away from the cleaning apparatus to a third cleaning process.

Figure 2:
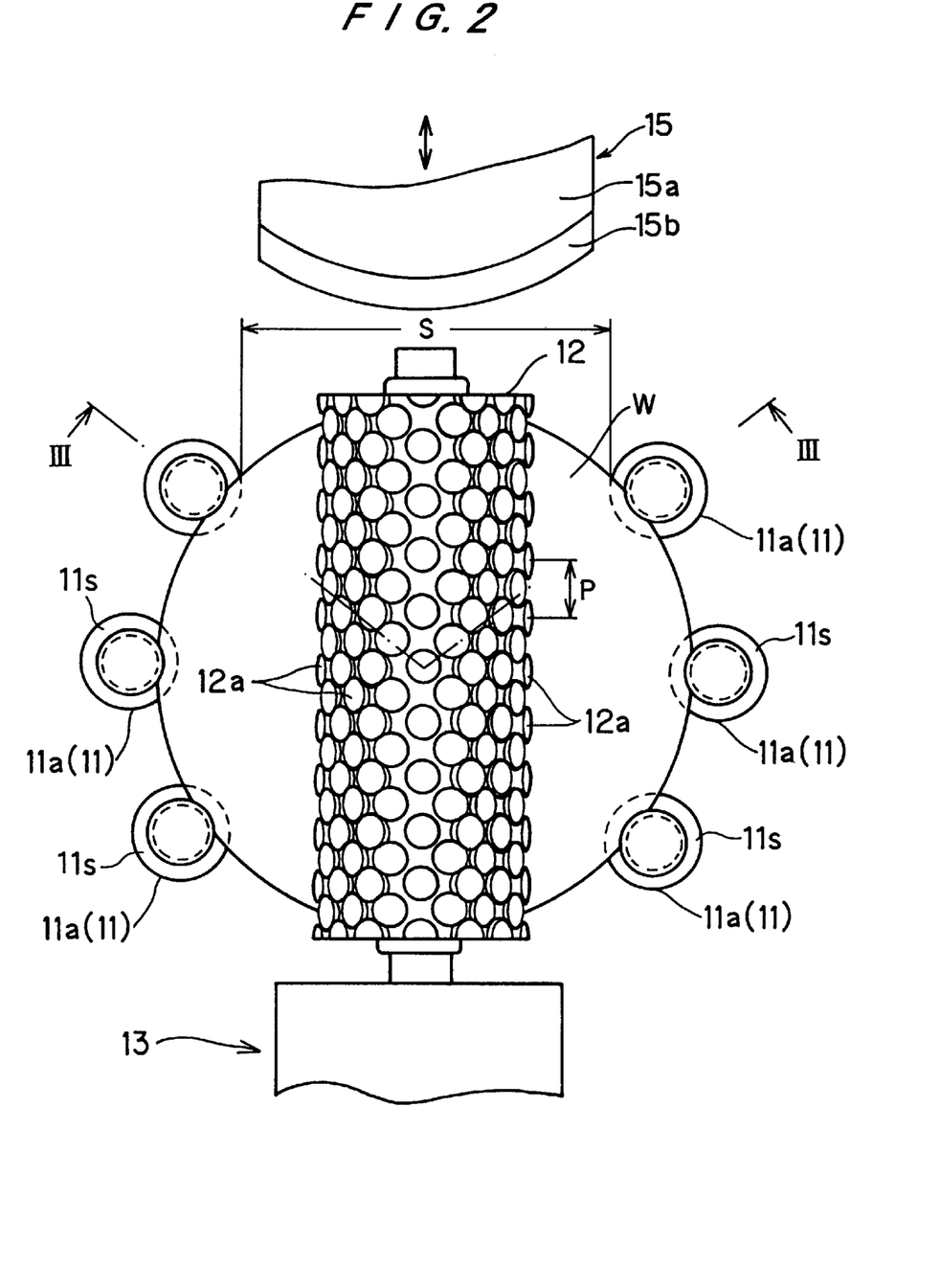
FIG. 2 is a plan view of a cleaning apparatus used in a third cleaning process according to the present invention.
Figure 3:
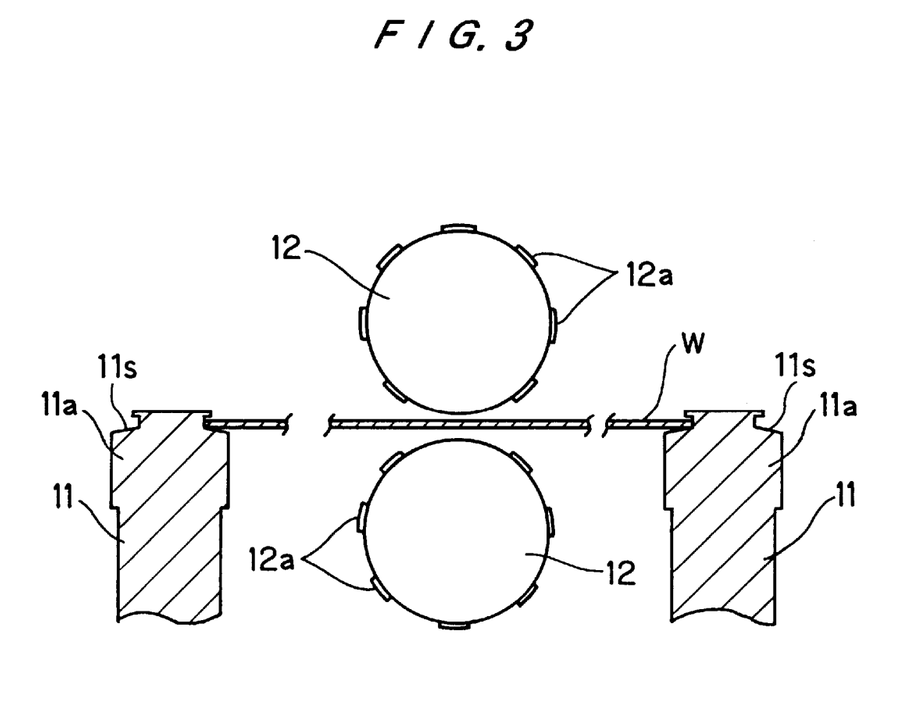
FIG. 3 is a cross-sectional view taken along line III—III of FIG. 2.

According to the third cleaning process, a brushing cleaning apparatus shown in FIGS. 2 and 3 is employed to clean the semiconductor wafer W. The brush cleaning apparatus shown in FIGS. 2 and 3 differs from the brush cleaning apparatus shown in FIG. 1 in that the upper and lower surfaces of the semiconductor wafer W are cleaned by a pair of identical brush arms 12. Those parts shown in FIGS. 2 and 3 which are identical to those shown in FIG. 1 are denoted by identical reference numerals. When the semiconductor wafer W is supplied to the brush cleaning apparatus shown in FIG. 2 by a robot hand 15, the brush arms 12 are moved away from the semiconductor wafer W. The robot hand 15 has a substantially rectangular-shaped support portion 15a for supporting the semiconductor wafer W, and guide portions 15b projecting from the supporting portion 15a for engaging with the circumferential edge of the semiconductor wafer W. The width of the support portion 15a is set to be smaller than the spacing S between the two groups 11GR, 11GL of the spindles 11. The rear end of the robot hand 15 is connected to a robot (not shown). When the semiconductor wafer W is held by the holding portions 11a of the spindles 11 as shown in FIG. 3, the brush arms 12 are brought into contact with the upper and lower surfaces of the semiconductor wafer W, respectively. The brush arms 12 are rotated about their own axes, and the semiconductor wafer W is also rotated about its own axis. While the cleaning liquid such as ultrapure water is being ejected from the cleaning liquid nozzles (not shown in FIGS. 2 and 3) to the surfaces of the semiconductor wafer W, the upper and lower surfaces of the semiconductor wafer W are cleaned by the respective brush arms 12. Thereafter, the semiconductor wafer will be cleaned in fourth and fifth cleaning processes (described below).

Each of the brush arms 12 will be described below. The brush arm 12 has a plurality of projections 12a disposed on its cylindrical surface and spaced longitudinally of the brush arm 12 at a predetermined pitch P. Rows of the projections 12a are spaced circumferentially at a given pitch around the brush arm 12. Adjacent ones of the projections 12a in the circumferential direction of the brush arm 12 are spaced from each other by a distance (P/2) which is half the pitch P in the longitudinal direction of the brush arm 12. When the brush arm 12 is rotated about its own axis, a first row of the projections 12a scrubs the semiconductor wafer W. Any surface areas of the semiconductor wafer W which have not been scrubbed by the first row of projections 12a are scrubbed by a second row of the projections 12a adjacent to the first row of the projections 12a. As the semiconductor wafer W is thus scrubbed by successive rows of the projections 12a, its entire surface is scrubbed by the projections 12a. As a result, the semiconductor wafer W is effectively cleaned by the brush arms 12.

The fourth and fifth cleaning processes will be described below. In the fourth cleaning process, the semiconductor wafer W is cleaned by a cleaning apparatus (not shown) which is similar to the cleaning apparatus shown in FIG. 1 except that the brush arm 12 beneath the semiconductor wafer W is dispensed with, and hence only the upper surface of the semiconductor wafer W is cleaned. In the fifth cleaning process, the semiconductor wafer W is cleaned by a cleaning apparatus (not shown) which is similar to the cleaning apparatus shown in FIG. 1 except that the brush arm 12 beneath the semiconductor wafer W and the cleaning unit 30 are dispensed with. According to the fifth cleaning process, therefore, a cleaning liquid such as ultrapure water which is the same as the cleaning liquid used in the first cleaning process is applied to the upper surface of the rotating semiconductor wafer W to be clean.

After having been cleaned in the fourth and fifth cleaning processes, the semiconductor wafer W is held by a drying apparatus (not shown) and rotated to remove any remaining liquid from the surfaces thereof under centrifugal forces. The cleaned semiconductor wafer W is thus dried.

Figure 5B:
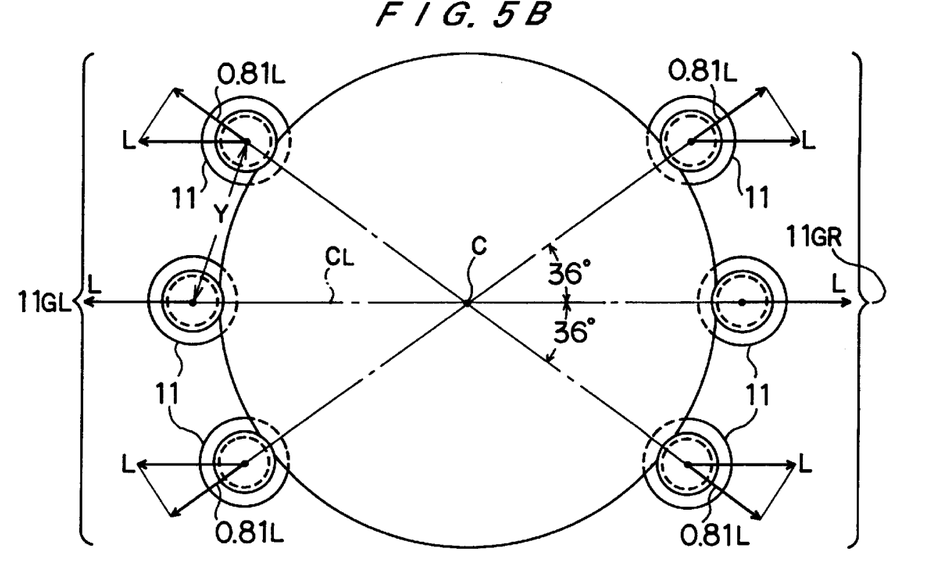

Next, the relationship between the spindles 11 and the semiconductor wafer in the present invention will be described below with reference to FIG. 5B.

In the present invention, as described above, the six spindles 11 are divided into two groups 11GR, 11GL, each comprising three spindles 11, which are independently driven by driving mechanisms, and the two groups 11GR, 11GL of the spindles 11 are displaced outwardly along a center line $C_L$ in opposite directions so that all of the spindles 11 are spaced from the semiconductor wafer W. The central spindle 11 in each of the groups 11GR, 11GL is positioned on the center line $C_L$ and the other two spindles 11 in each of the groups 11GR, 11GL are positioned at an angle of 36° away from the center line $C_L$. Assuming that each of the groups 11GR, 11GL of the spindles 11 is displaced along the center line $C_L$ by a distance L, the spindle 11 positioned on the center line $C_L$ is also displaced by the distance L in a radial direction from the center C of the semiconductor wafer W to be supplied. However, the other two spindles 11 positioned apart from the center line $C_L$, are displaced by the distance L COS 36°=0.81 L in a radial direction from the center C of the semiconductor wafer W to be supplied. Therefore, while the distance L is maintained within the width of the shoulder of the spindle, a suitable clearance between the holding portions 11a of the spindles 11 and the semiconductor wafer W can be formed at the spindles 11 positioned apart from the center line $C_L$, when positioning the semiconductor wafer among the spindles.

In the present invention, the pitch Y between tote adjacent spindles 11 is set to be larger than the length of the orientation flat , i.e., the length of a chord, so that the orientation flat is not brought into contact with the holding portions 11a of two of the spindles 11 simultaneously. In this example, the pitch Y between the adjacent spindles 11 is 61.7 mm, because the length of the orientation flat in the semiconductor wafer having a diameter of eight inches (200 mm) is 57.5 mm.

According to experiments by the inventors, it is proved to be preferable that the groups of the spindles 11 comprise two groups of not less than three spindles 11, and when each of the two groups of the spindles 11 is displaced by a distance L as an integral group in a radial direction from a center C of the semiconductor W, all of the spindles 11 in each group are displaced by a distance of not less than 0.7 L. In the case where each of the two groups of the spindles 11 comprises three spindles 11, it is desirable that the central spindle 11 in each of the groups 11GR, 11GL is positioned on the center line $C_L$, and other two spindles 11 in each of the groups 11GR, 11GL are positioned at an angle of 45° or less.

Figure 6:
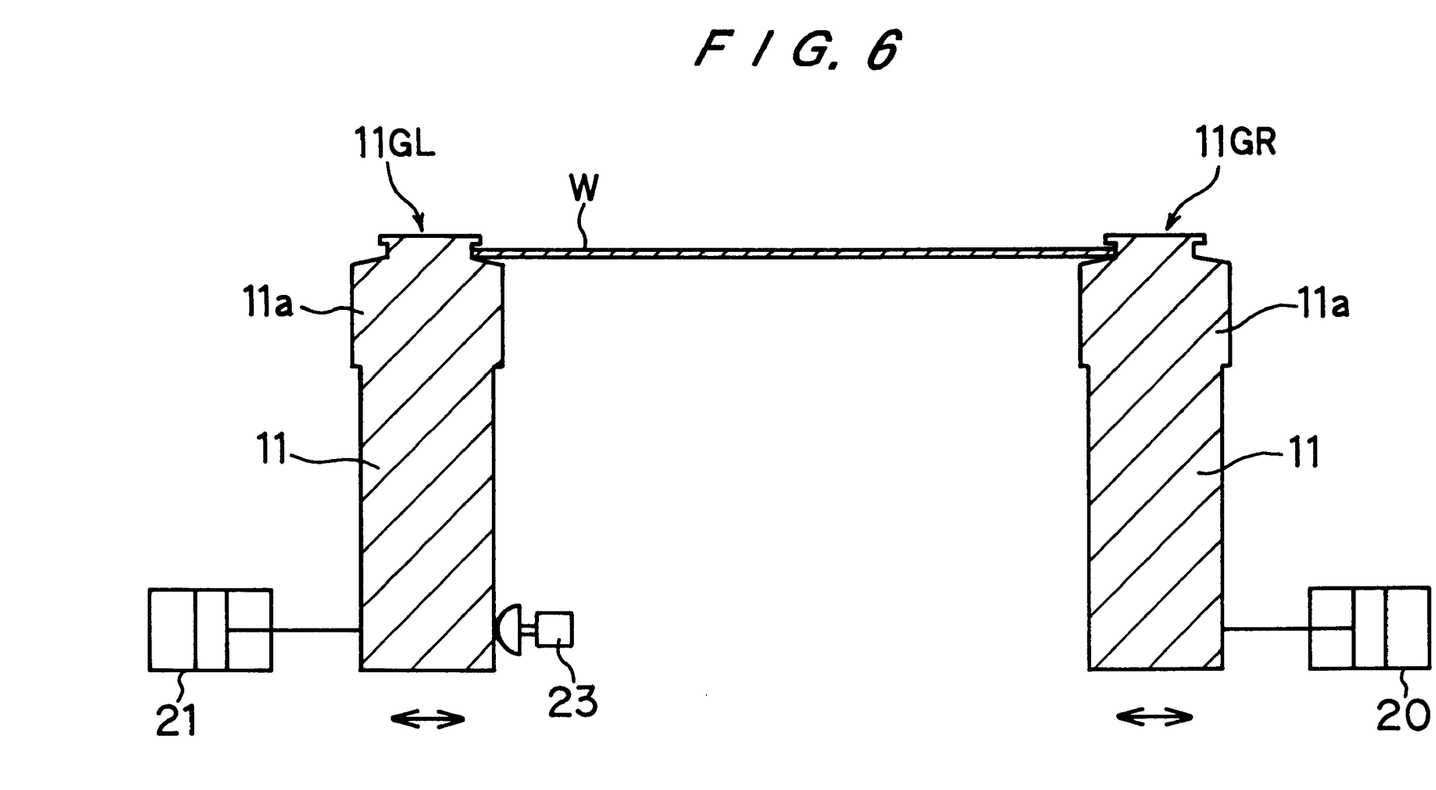
FIG. 6 is a schematic view showing driving mechanisms of the spindles.

FIG. 6 shows moving mechanisms for moving the groups of the spindles 11 horizontally. As shown in FIG. 6, the group 11GR of the spindles 11 is moved by an air cylinder 20, and the group 11GL of the spindles 11 is moved by an air cylinder 21. The movement of group 11GL of the spindles 11 is stopped by a stopper 23. The pressing force of the air cylinder 20 is smaller than the pressing force of the air cylinder.

With the above structure, when the semiconductor wafer W is held by the holding portions 11a of the spindles 11, the holding portions 11a in the group 11GL are fixed at predetermined positions by the stopper 23, and the holding portions 11a in the group 11GR follow slightly horizontal movement of the semiconductor wafer W so that the holding portions 11a in the group 11GR press the semiconductor wafer W against the holding portions 11a in the group 11GL by a moderate pressing force. This specific structure of the moving mechanisms allows the semiconductor wafer W having a certain tolerance to be held reliably by the holding portions 11a of the spindles 11 during cleaning.

While the present invention has been described as being applied to the cleaning of semiconductor wafers, the principles of the present invention are also applicable to the cleaning of glass substrates or LCDs (liquid crystal displays). In FIGS. 1 through 3, the semiconductor wafer W is supplied to the cleaning apparatus in a direction parallel to the longitudinal direction of the brush arm or arms 12. However, the semiconductor wafer W may be supplied to the cleaning apparatus in a direction inclined at a desired angle to the longitudinal direction of the brush arm or arms 12. In that case, the holding portions lha of the spindles 11 may be positioned so as not to physically interfere with the feeding direction of the semiconductor wafer W and the longitudinal direction of the brush arm or arms 12. Further, as a cleaning liquid, aqueous ammonia or hydrofluoric acid may be used other than pure water or ultrapure water.

In the illustrated embodiments, the cleaning member is held in sliding contact with the opposite surfaces or the upper surface of the planar workpiece. However, the cleaning member may be held in sliding contact with only the lower surface of the planar workpiece. The cleaning member may be held in sliding contact with at least one of the upper and lower surfaces of the planar workpiece, and the cleaning liquid nozzle may supply the cleaning liquid to at least one of the upper and lower surfaces of the planar workpiece.

In FIG. 1, all of the holding portions 11a of the spindles 11 may be positively driven to impart rotative forces to the semiconductor wafer W, with no holding portions serving as bearings. While two out of the six holding portions 11a are positively driven to impart rotative forces to the semiconductor wafer W in the illustrated embodiments, one or three or more holding portions 11a may be positively driven to impart rotative forces to the semiconductor wafer W. In addition, the number of the holding portions 11a is not limited to six, and may be changed.

With the illustrated arrangement, the spindles 11 are clustered into closely positioned two groups so as not to physically interfere with the robot hand and the brush arm or arms 12, and hence the robot hand, the brush arm or arms 12, and the spindles 11 having the holding portions 11a may be positioned in widely spaced relation to each other. Consequently, the brush arms or arms 12 may be installed with ease and the robot hand may be moved easily alone a desired path. Furthermore, the dimensions and path of the robot hand, the diameter and position of the brush arm or arms 12, and the diameter of the holding portions 11a can be designed with greater freedom.

Although certain preferred embodiments of the present invention have been shown and described in detail, it should be understood that various changes and modifications may be made therein without departing from the scope of the appended claims.

What is claimed is:

1. An apparatus for cleaning a thin disk-shaped workpiece, said apparatus comprising:

a support mechanism for supporting a workpiece and rotating the workpiece about an axis thereof, said support mechanism including a plurality of spindles having at upper ends thereof respective rotatable holding portions with respective circumferential edges engageable with a circumferential edge of the workpiece, said spindles being clustered into two groups of spindles, each said group including at least three spindles including a center spindle and other spindles positioned on opposite sides of said center spindle, with a spacing between said two groups of spindles, said spacing being wider than a widest spacing between two adjacent said spindles within each said group of spindles, and a path along which the workpiece is supplied to and removed from said support mechanism being located within said spacing, said spindles of each said group being displaceable together rectilinearly and being relatively positioned such that displacement of said center spindle by a distance L insures that said other spindles are displaced by a distance of at least 0.7 L;

a nozzle for supplying a cleaning liquid to at least one of the opposite surfaces of the workpiece; and a cleaning member to be in sliding contact with at least one of opposite surfaces of the workpiece, said cleaning member being rotatable about an axis thereof, said cleaning member comprising a roll brush extending in a direction to be diametrically across and parallel to the workpiece, and said groups of spindles are positioned to not physically interfere with said roll brush.

2. An apparatus as claimed in claim 1, wherein the workpiece is to be of substantially circular shape, said groups of spindles comprise two said groups, each said group including at least three said spindles, and each said group being displaceable as an integral group by a distance L in a radial direction from a center of the workpiece during which displacement all of said spindles of said each group are displaced in said radial direction by a distance of at least 0.7 L.

3. An apparatus as claimed in claim 2, further comprising moving mechanisms for moving respective said two groups of said spindles, one said moving mechanism exerting a smaller pressing force than the other said moving mechanism.

4. An apparatus as claimed in claim 1, wherein the workpiece is to be of substantially circular shape, said holding portions of said spindles are positioned on a circle to be along the circumferential edge of the workpiece, said roll brush extends along said path, and said groups of spindles comprise two said groups positioned substantially symmetrically with respect to the rotating axis of the workpiece.

5. An apparatus as claimed in claim 1, wherein said spindles are movable outwardly, whereby the workpiece can be supplied to a position over said holding portions of said spindles and then lowered to position an outer peripheral portion of the workpiece on shoulders of said holding portions, and wherein said spindles then are movable inwardly to engage said holding portions with the circumferential edge of the workpiece.

6. An apparatus as claimed in claim 5, wherein said spindles then are movable outwardly to enable the workpiece to be removed from said support mechanism by being lifted therefrom.

7. An apparatus for cleaning a thin disk-shaped workpiece of substantially circular shape, said apparatus comprising:

a support mechanism for supporting a workpiece and rotating the workpiece about an axis thereof, said support mechanism including a plurality of spindles having at upper ends thereof respective rotatable holding portions with respective circumferential edges engageable with a circumferential edge of the workpiece, said spindles being clustered into groups of spindles, with a spacing between two adjacent said groups of spindles, said spacing being wider than a widest spacing between two adjacent said spindles within each said group of spindles, and a path along which the workpiece is supplied to and removed from said support mechanism being located within said spacing;

moving mechanisms for moving respective said two groups of said spindles, one said moving mechanism exerting a smaller pressing force than the other said moving mechanism;

a nozzle for supplying a cleaning liquid to at least one of the opposite surfaces of the workpiece; and a cleaning member to be in sliding contact with at least one of the opposite surfaces of the workpiece, said cleaning member being rotatable about an axis thereof.

8. An apparatus as claimed in claim 7, wherein said holding portions of said spindles are positioned on a circle to be along the circumferential edge of the workpiece, said cleaning member extends along said path, and said two groups of spindles are positioned substantially symmetrically with respect to the rotating axis of the workpiece.

9. An apparatus as claimed in claim 7, wherein said spindles are movable outwardly, whereby the workpiece can be supplied to a position over said holding portions of said spindles and then lowered to position an outer peripheral portion of the workpiece on shoulders of said holding portions, and wherein said spindles then are movable inwardly to engage said holding portions with the circumferential edge of the workpiece.

10. An apparatus as claimed in claim 9, wherein said spindles then are movable outwardly to enable the workpiece to be removed from said support mechanism by being lifted therefrom.

11. An apparatus as claimed in claim 7, wherein each said group of spindles includes at least three spindles including a center spindle and other spindles positioned on opposite sides of said center spindle, said spindles of each said group being displaceable together rectilinearly and being relatively positioned such that displacement of said center spindle by said distance L insures that said other spindles are displaced by said distance of at least 0.7 L.

12. An apparatus for cleaning a thin disk-shaped workpiece, said apparatus comprising:

a support mechanism for supporting a workpiece and rotating the workpiece about an axis thereof, said support mechanism including a plurality of spindles having at upper ends thereof respective rotatable holding portions with respective circumferential edges engageable with a circumferential edge of the workpiece, said spindles being clustered into groups of spindles with a spacing between two adjacent said groups of spindles, said spacing being wider than a widest spacing between two adjacent said spindles within each said group of spindles, and a path along which the workpiece is supplied to and removed from said support mechanism being located within said spacing, said spindles being movable outwardly, whereby the workpiece can be supplied to a position over said holding portions of said spindles and then lowered to position an outer peripheral portion of the workpiece on shoulders of said holding portions, and said spindles then being movable inwardly to engage said holding portions with the circumferential edge of the workpiece;

a nozzle for supplying a cleaning liquid to at least one of the opposite surfaces of the workpiece; and a cleaning member to be in sliding contact with at least one of opposite surfaces of the workpiece, said cleaning member being rotatable about an axis thereof.

13. An apparatus as claimed in claim 12, wherein the workpiece is to be of substantially circular shape, said groups of spindles comprise two said groups, each said group including at least three said spindles, and each said group being displaceable as an integral group by a distance L in a radial direction from a center of the workpiece during which displacement all of said spindles of said each group are displaced in said radial direction by a distance of at least 0.7 L.

14. An apparatus as claimed in claim 12, wherein the workpiece is to be of substantially circular shape, said holding portions of said spindles are positioned on a circle to be along the circumferential edge of the workpiece, said cleaning member extends along said path, and said groups of spindles comprise two said groups positioned substantially symmetrically with respect to the rotating axis of the workpiece.

15. An apparatus as claimed in claim 12, wherein said spindles then are movable outwardly to enable the workpiece to be removed from said support mechanism by being lifted therefrom.

16. An apparatus as claimed in claim 12, comprising two said groups of spindles, each said group including at least three spindles including a center spindle and other spindles positioned on opposite sides of said center spindle, said spindles of each said group being displaceable together rectilinearly and being relatively positioned such that displacement of said center spindle by a distance L insures that said other spindles are displaced by a distance of at least 0.7 L.

17. An apparatus for cleaning a thin disk-shaped workpiece, said apparatus comprising:

a support mechanism for supporting a workpiece and rotating the workpiece about an axis thereof, said support mechanism including a plurality of spindles having at upper ends thereof respective rotatable holding portions with respective circumferential edges engageable with a circumferential edge of the workpiece, said spindles being clustered into groups of spindles with a spacing between two adjacent said groups of spindles, said spacing being wider than a widest spacing between two adjacent said spindles within each said group of spindles, and a path along which the workpiece is supplied to and removed from said support mechanism being located within said spacing, said spindles being movable outwardly, whereby the workpiece can be supplied to a position over said holding portions of said spindles and then lowered to position an outer peripheral portion of the workpiece on shoulders of said holding portions, and wherein said spindles then are movable inwardly to engage said holding portions with circumferential edge of the workpiece;

a nozzle for supplying a cleaning liquid to at least one of the opposite surfaces of the workpiece; and a cleaning member to be in sliding contact with at least one of opposite surfaces of the workpiece, said cleaning member being rotatable about an axis thereof, said cleaning member comprising a roll brush extending in a direction to be diametrically across and parallel to the workpiece, and said groups of spindles are positioned to not physically interfere with said roll brush.

* * * * *